United States Patent
Tsai et al.

(10) Patent No.: US 7,580,001 B2
(45) Date of Patent: Aug. 25, 2009

(54) ANTENNA STRUCTURE FOR INTEGRATED CIRCUIT DIE USING BOND WIRE

(75) Inventors: Chi Taou Tsai, Chandler, AZ (US); Ricardo A. Uscola, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 222 days.

(21) Appl. No.: 11/753,749

(22) Filed: May 25, 2007

(65) Prior Publication Data

US 2008/0291107 A1     Nov. 27, 2008

(51) Int. Cl.
*H01Q 19/30* (2006.01)
*H01Q 9/26* (2006.01)

(52) U.S. Cl. .................. 343/819; 343/803; 343/818; 343/820

(58) Field of Classification Search .......... 343/803, 343/818, 819, 820, 700 MS
See application file for complete search history.

(56) References Cited

U.S. PATENT DOCUMENTS

| | | | |
|---|---|---|---|
| 5,972,156 A * | 10/1999 | Brady et al. | 156/280 |
| 6,818,985 B1 | 11/2004 | Coccioli et al. | |
| 7,295,161 B2 * | 11/2007 | Gaucher et al. | 343/700 MS |

| | | | |
|---|---|---|---|
| 2005/0122265 A1 | 6/2005 | Gaucher et al. | |
| 2006/0017650 A1 | 1/2006 | Allen et al. | |

OTHER PUBLICATIONS

Pfeiffer, Turning the Millimeter Wave World Upside-down: How Can We Leverage Silicon Economics of Scale of Packaging?, International Wireless Industry Consortium, San Diego, California, Mar. 4, 2006.
Segura, et al., On-Wafer Radiation Pattern Measurements of Integrated Antennas on Standard BiCMOS and Glass Processes for 40-80GHz Applications, IEE International Conference on Microelectronic Test Structures, vol. 18, pp. 107-111, Apr. 2005.
Babakhani, et al., A 77GHz 4-Element Phased Array Receiver With On-Chip Dipole Antennas in Silicon, IEEE International Solid-State Circuits Conference, Session 10, pp. 3-5, 2006.

* cited by examiner

*Primary Examiner*—Hoang V Nguyen
(74) *Attorney, Agent, or Firm*—Meschkow & Gresham PLC

(57) ABSTRACT

A device 20 includes a substrate 22 having an integrated circuit (IC) die 24 coupled thereto. A bond wire 28 interconnects a die bond pad 32 on the IC die 24 with an insulated bond pad 36. Another bond wire 38 interconnects a die bond pad 42 on the IC die 24 with another insulated bond pad 46. The bond wires 28 and 38 serve as radiating elements of a dipole antenna structure 64. A reflector 72 and director 74 can be located on the substrate 22 and/or the IC die 24 to reflect and/or direct a radiation pattern 66 emitted by or received by the antenna structure 64. A trace 82 can be interconnected between the insulated bond pads 36, 46 to form a folded dipole antenna structure 84.

18 Claims, 3 Drawing Sheets

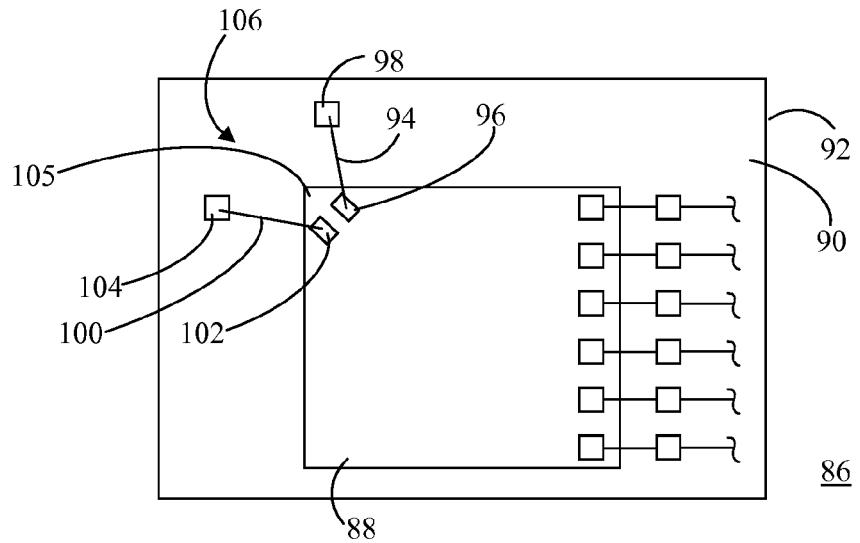
FIG. 6
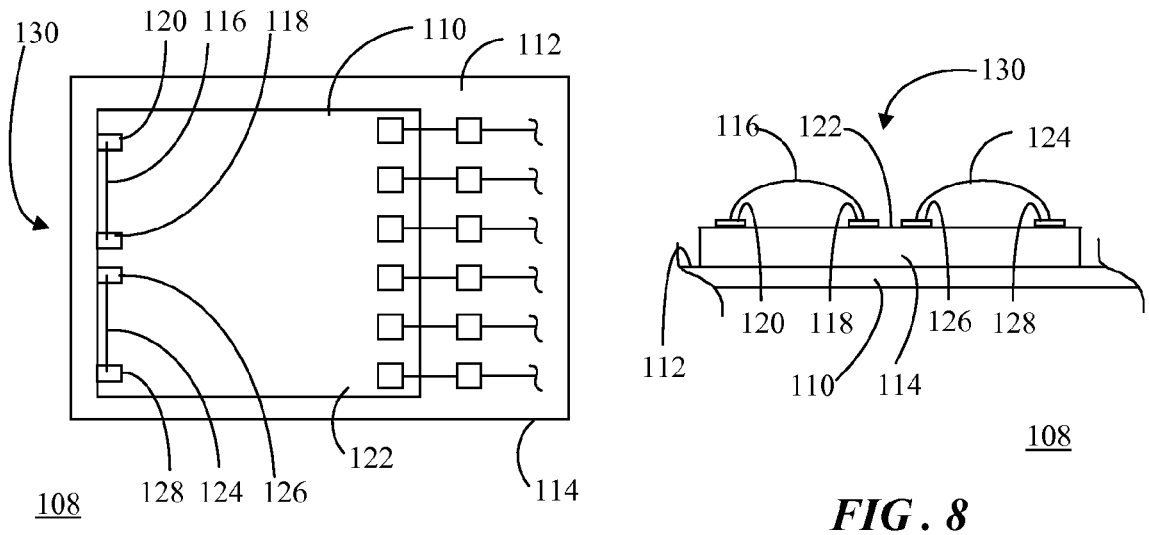
FIG. 7
FIG. 8
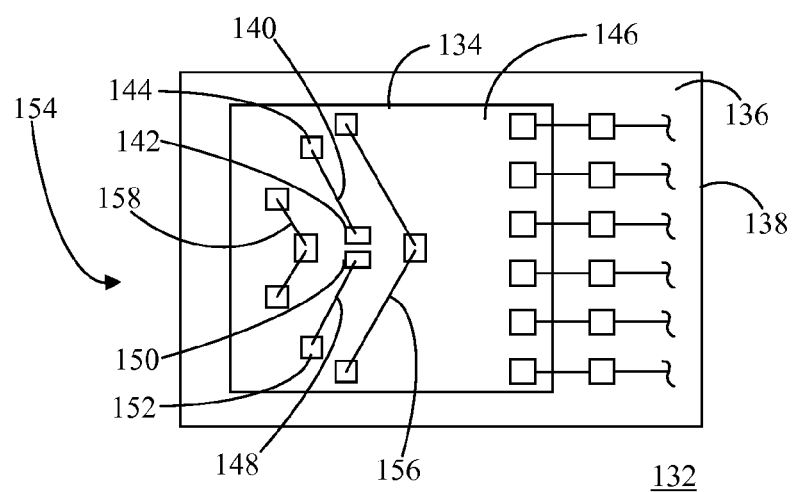
FIG. 9

ANTENNA STRUCTURE FOR INTEGRATED CIRCUIT DIE USING BOND WIRE

TECHNICAL FIELD OF THE INVENTION

The present invention relates generally to antennas. More specifically, the present invention relates to an antenna structure packaged with an integrated circuit die.

BACKGROUND OF THE INVENTION

The millimeter wave frequency band is becoming an increasingly attractive option in a broad range of products and services, including high-speed, point-to-point wireless local area networks, broadband Internet access, and point-to-multipoint communications. Other examples include satellite, radar, mobile collision detection, and imaging. Because of shorter wavelengths, the millimeter wave frequency band permits the use of smaller antennas than would typically be called for under similar circumstances in the lower bands to achieve the same high directivity and high gain. A consequence of this high directivity is the possibility of a more efficient use of the spectrum. That is, a greater number of highly directive antennas can be placed in a given area than less directive antennas. The net result is higher reuse of the spectrum and a higher density of users as compared to lower frequencies.

Unfortunately, the development of millimeter wave (MMW) devices has been hindered in part by difficulties associated with the design and development of the radiating structures, i.e., antennas, for MMW devices, and more particularly, with forming interconnects between an integrated circuit and the radiating structures. One approach for integrating an antenna in a MMW device involves printing a planar antenna, such as a microstrip or patch antenna, on a circuit board, or substrate, and forming interconnects between an integrated circuit die and the antenna. Such planar antennas may be relatively low cost and can be readily manufactured and integrated within a MMW device. However, discontinuities of chip interconnects, like bond wires, between a transceiver and the planar antenna are difficult to control due to the extremely short wavelength of a millimeter band wave, i.e., on the order of one to ten millimeters. Consequently, chip interconnect discontinuities are a critical limiting factor in antenna performance. Furthermore, this microstrip or patch antenna printed on the circuit board has the undesirable effect of utilizing valuable real estate on the circuit board. Wire antennas or cavity antennas have also been considered for use with MMW devices as alternatives to printed-circuit patch antennas due to their broad bandwidth, low loss, and reduced dependence on substrate real estate. However, fabrication difficulty has limited their implementation in a cost effective and integrated manner.

Accordingly, what is needed is an antenna structure that does not suffer from interconnect discontinuities, is small, and is cost effectively fabricated using existing manufacturing processes.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 6 shows a top plan view of a device in accordance with another embodiment of the invention;

FIG. 7 shows a top plan view of a device in accordance with another embodiment of the invention;

FIG. 8 shows a side sectional view of the device of FIG. 7; and

FIG. 9 shows a top plan view of a device in accordance with another embodiment of the invention.

DETAILED DESCRIPTION

Embodiments of the invention include antenna structures that are constructed utilizing bond wires as radiating elements coupled to integrated circuit dies that efficiently operate at millimeter wave frequencies. The application of bond wires as antenna structures using a wire bonding technique eliminates the need for interconnect structures between an integrated circuit die and a remotely positioned antenna, thereby preventing the problem of discontinuities between the integrated circuit die and the remotely positioned antenna.

Figure 1:
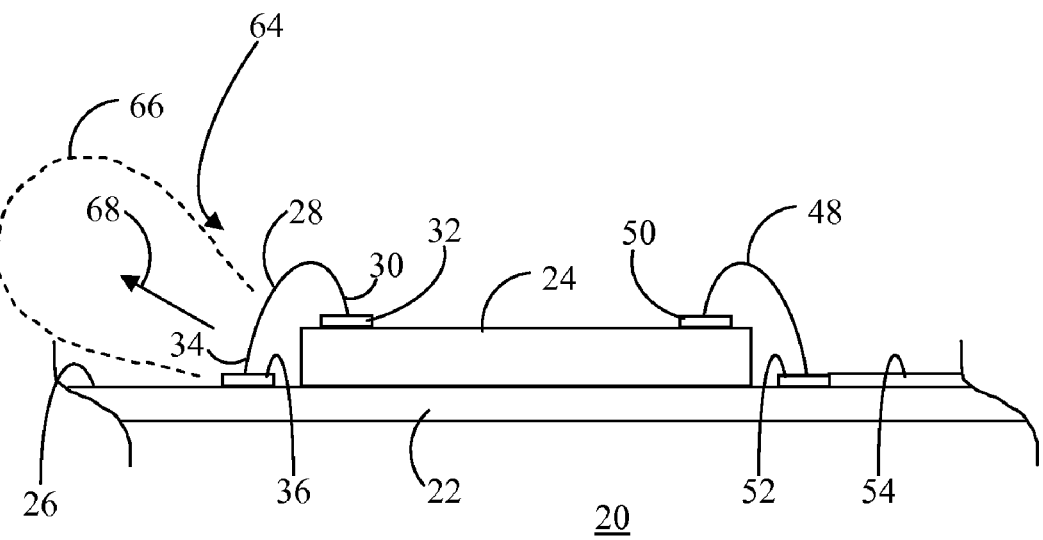
FIG. 1 shows a side view of a device in accordance with an embodiment of the invention.
Figure 2:
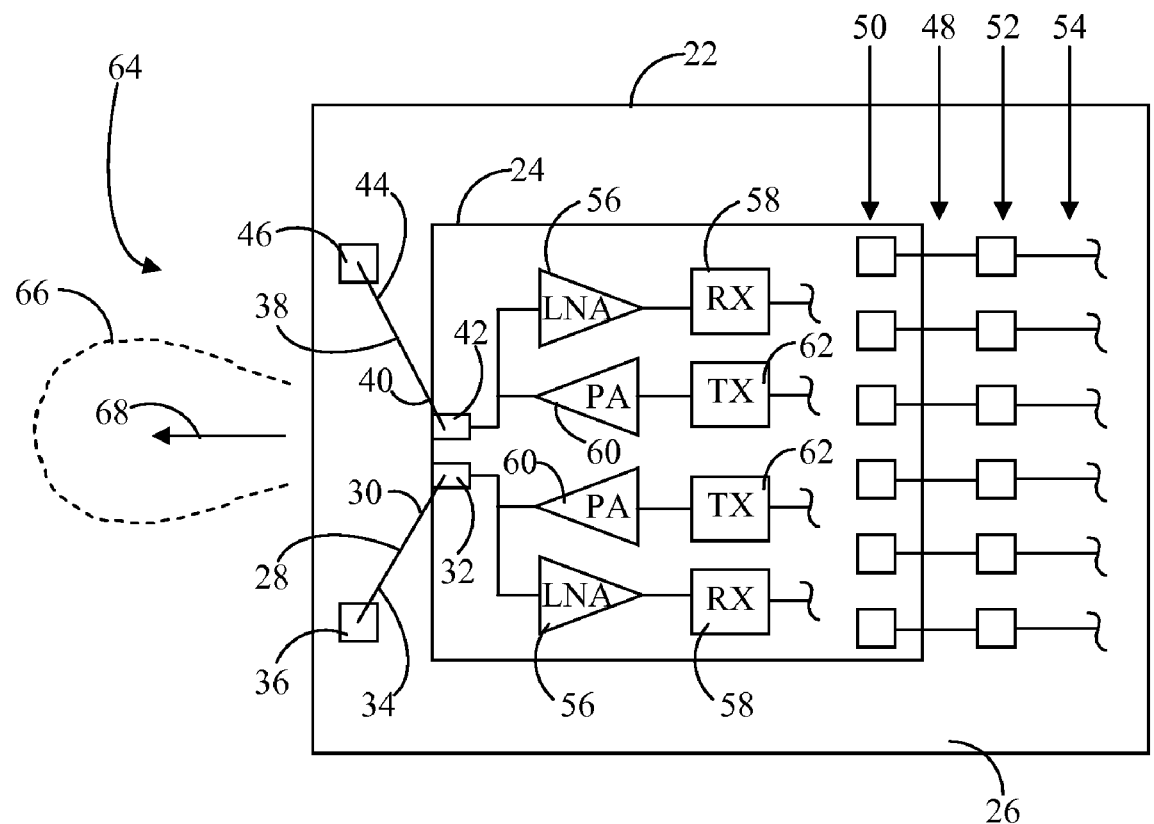
FIG. 2 shows a top plan view of the device of FIG. 1.

Referring to FIGS. 1-2, FIG. 1 shows a side view of a device 20 in accordance with an embodiment of the invention, and FIG. 2 shows a top plan view of device 20. Device 20 includes a substrate 22, which provides support for an integrated circuit (IC) die 24. It should be understood that the term "integrated circuit die" may also be referred to herein as a "semiconductor die," a "die," a "chip," or a "semiconductor chip." IC die 24 is attached to a top surface 26 of substrate 22 utilizing known materials and processes.

Device 20 further includes a bond wire 28 having an end 30 attached to a die bond pad 32 on IC die 24. Another end 34 of bond wire 28 is physically coupled to an insulated bond pad 36 bonded to top surface 26 of substrate 22. Similarly, device 20 includes a bond wire 38 having an end 40 attached to a die bond pad 42 on IC die 24. Another end 44 of bond wire 38 is coupled to an insulated bond pad 46 bonded to top surface 26 of substrate 22. One or more bond wires 48 interconnect one or more die bond pads 50 on IC die 24 with one or more input/output bond pads 52 bonded to top surface 26 of substrate 22. Input/output bond pads 52 are, in turn, interconnected with traces 54 formed on top surface 26 of substrate 22.

A "bond pad" is a contact area on a chip or on a substrate to which a wire is to be attached in a wire bonding process. The term "insulated" bond pad is used herein to define a bond pad that is not electrically connected to other traces or components other than those components that make up an antenna structure, discussed below. Thus, insulated bond pads 36, 46 are insulated, or isolated, from the remaining circuitry of device 20, and any additional circuitry that makes up the larger system into which device 20 is incorporated. The implementation of an insulated bond pad directly contrasts with typical bond pads, such as input/output bond pads 52. Input/output bond pads 52 form interconnects with other components and/or traces, represented by traces 54, for conveyance of input/output signals, making a ground connection, and so forth. Thus, input/output bond pads 52 are used to make electrical connections from IC die 24 to circuitry external to IC die 24.

IC die 24 may be a millimeter wave (MMW) device that includes various internal components used to form transmitter and/or receiver circuitry for the transmission and/or receipt of millimeter wave signals, i.e. those signals in the range of 30-300 GHz. These internal components may include, for example, low noise amplifiers 56 in communication with receive circuitry 58, power amplifiers 60 in communication with transmit circuitry 62, and any support circuitry for implementing a communication chip package. As particularly shown in FIG. 2, one of low noise amplifiers 56 and one of power amplifiers 60 is electrically connected to die bond pad 32. Similarly, one of low noise amplifiers 56 and one of power amplifiers 60 is electrically connected to die bond pad 42. Thus, IC die 24 functions as a transceiver. Low noise amplifiers 56, receive circuitry 58, power amplifiers 60, and transmit circuitry 62 are visible in FIG. 2 for purposes of discussion. However, is should be readily apparent to those skilled in the art that elements 56, 58, 60, 62, and other support circuitry are embedded within IC die 24.

Bond wires 28, 38, and 48 are very fine wires typically used to interconnect semiconductor components, such as IC die 24, with each other components via bond pads. Bond wires 28, 38, and 48 are attached to their respective die bond pads 32, 42, and 50, and substrate positioned bond pads 36, 46, and 52 using a conventional wire bonding process. Gold and aluminum are materials commonly used to form bond wires 28, 38, and 48, although other known or upcoming materials may be used. In a wire bonding process, bond wires 28, 38, and 48 are attached at both ends to their respective bond pads using some combination of heat, pressure, ultrasonic energy, or other means to make a weld. Wire bonding is generally considered to be a cost-effective and flexible interconnect technology, and is used to assemble the vast majority of semiconductor packages.

In accordance with one embodiment, bond wires 28 and 38 form an antenna structure 64 for the components of IC die 24. That is, each of bond wires 28 and 38 serves as a radiating element in a dipole configuration of antenna structure 64. A dipole configuration of antenna structure 64 is useful for transceiver integrated circuits, such as IC die 24, that may call for differential input/output from their associated communication circuitry, i.e. low noise amplifiers 56 with receive circuits 58 and power amplifiers 60 with transmit circuits 62. Furthermore, a dipole antenna configuration is wide band, hence the resonant frequency is not sensitive to bond wire length. In addition, a dipole antenna configuration is inherently a balanced antenna because it is bilaterally symmetrical, and it can be oriented horizontally, vertically, or at a slant.

In one embodiment, a wire length for bond wires 28 and 38 attached using a wire bonding method can be approximately one millimeter. Thus, at a frequency of 77 GHz, the wavelength is 3.9 mm. Consequently, each of the one millimeter long bond wires 28 and 38 is approximately one quarter of a wavelength, yielding a half wavelength dipole configuration of antenna structure 64. Those skilled in the art will recognize that in alternative embodiments, bond wire length can be even lower, for example, 0.5 mm, 0.4 mm, and the like. These shorter bond wires may be useful at frequencies greater than 77 GHz. A typical bond wire diameter is approximately 25 microns. Other conventionally utilized bond wire diameters are 1 and 10 mils. Thicker bond wire diameter or a ribbon-type bond wire can improve radiation efficiency and slightly widen the bandwidth of antenna structure 64.

The dipole configuration of antenna structure 64 produces a radiation pattern 66 in a pre-determined direction 68. Pre-determined direction 68 of radiation pattern 66 is determined by the surrounding structures including IC chip 24, other bonding wires, and substrate 22. As shown in FIG. 2, bond wires 28 and 38 are slightly angled toward one another. This orientation of bond wires 28 and 38 effectively increases antenna gain in pre-determined direction 68. The profile of bond wires 28 and 38 also affects radiation pattern 66. As shown in FIG. 2, the maximum power of radiation pattern 66 can be directed slightly up or slightly down depending upon the profile. Accordingly, bond wire orientation and profile adds to the design flexibility of antenna structure 64.

Since the interconnects themselves, i.e., bond wires 28 and 38, directly serve as radiating elements for millimeter wave IC die 24, the need for interconnects between IC die 24 and a remote antenna structure are eliminated. Thus, the associated problem of interconnect discontinuities is resolved. Moreover, the use of bond wires 28 and 38 is a low-cost solution for millimeter wave products since the radiating elements are implemented from existing packaging/interconnect structures using existing manufacturing processes.

In an embodiment, insulated bond pads 36 and 46 are electrically conductive, although insulated or isolated from other electrically conductive structures on substrate 22. The electrical conductivity of insulated bond pads 36 and 46 contributes to antenna structure 64 for capacitance loading of bond wires 28 and 38. Capacitance loading of bond wires 28 and 38 using insulated bond pads 36 and 46 can improve radiating efficiency while providing structural stability for bond wires 28 and 38.

Although the dipole configuration of antenna structure 64 is discussed in connection with differential signal reception and transmission the present invention may be readily implement with an unbalanced, or single-ended signal. In such a situation, a balun (balanced-unbalanced) signal transformer may be inserted between antenna and the feed line between the transmitting and/receiving circuitry. Thus, the die bond pad(s) can form part of the balun structure.

Figure 3:
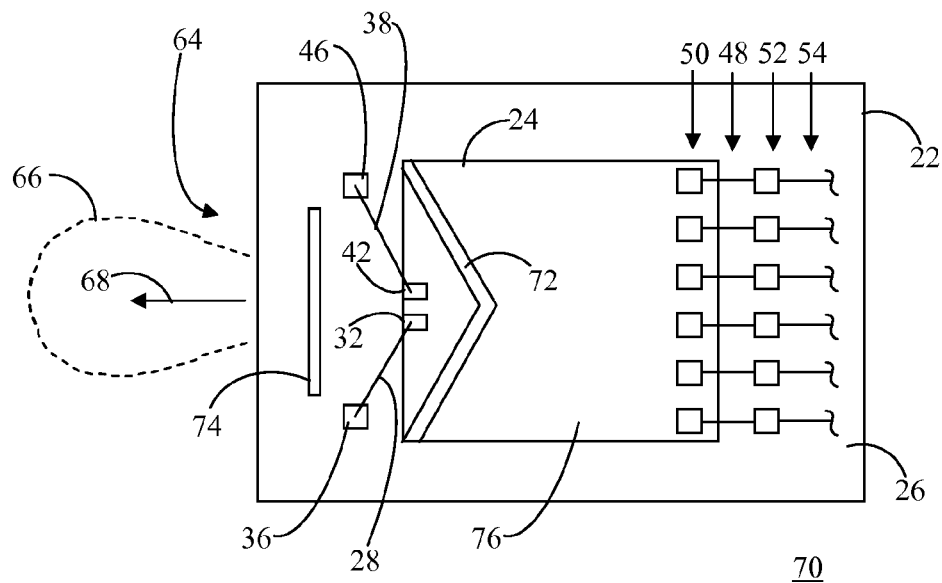
FIG. 3 shows a top plan view of a device in accordance with another embodiment of the invention.
Figure 4:
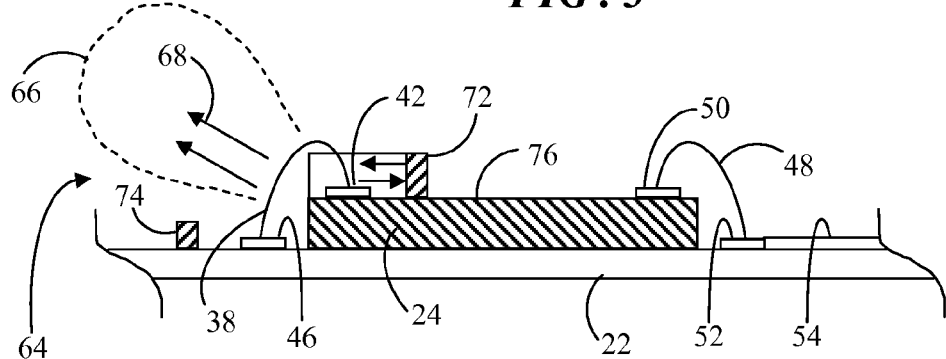
FIG. 4 shows a side cross-sectional view of the device of FIG. 3.

Referring to FIGS. 3-4, FIG. 3 shows a top plan view of a device 70 in accordance with another embodiment of the invention, and FIG. 4 shows a cross-sectional side view of device 70. Device 70 includes IC die 24 coupled to top surface 26 of substrate 22. In addition, device 70 includes bond wire 28 interconnecting die bond pad 32 with insulated bond pad 36, and device 70 includes bond wire 38 interconnecting die bond pad 42 with insulated bond pad 46. Thus, bond wires 28 and 38 form dipole configuration of antenna structure 64. Like device 20 (FIG. 1), device 70 further includes bond wires 48 interconnecting die bond pads 50 on IC die 24 with input/output bond pads 52 bonded to top surface 26 of substrate 22 which are, in turn, interconnected with traces 54 formed on top surface 26 of substrate 22.

A dipole antenna typically radiates forward and backward substantially equally. Accordingly, device 70 includes further structures that can improve antenna gain and improve and/or redirect radiation pattern 66. In this example, device 70 includes a reflector 72 and a director 74. However, in other embodiments, a device 70 may include only reflector 72 or only director 74.

Reflector 72 can be formed from a bond wire or other conductive structure on a top surface 76 of IC chip 24. In this example, reflector 72 includes two sections angled toward one another. However, in other embodiments, reflector 72 may curved or straight, and may extend beyond the outer perimeter of IC die 24 to at least partially attach to top surface 26 of substrate 22. Reflector 72 is located on surface 76 between die bond pads 50 and die bond pads 36 and 46. Reflector 72 reradiates back into free space impinging radiation coming from or going to antenna structure 64. In this scenario, reflector 72 reradiates radiation generally back in the direction that it came from. Reflection of the radiation serves to increase the antenna gain, i.e., increase the energy of radiation pattern 66 in pre-determined direction 68. In addition, most of the energy of radiation pattern 66 is reflected away from IC die 24, thereby significantly isolating IC die 24, as well as bond pads 50 and 52, and bond wires 48 from the emitted or received radiation.

Director 74 may be formed from copper traces or bond wires attached to top surface 26 of substrate 22. In this example, director 74 is formed from one generally straight section. However, in other embodiments, director 74 may be curved or angled, and may extend to the outer perimeter of IC die 24 to at least partially attach to IC die 24. Director 74 functions to direct radiation pattern 66 upwardly away from substrate 22. Although bond wires do not contribute significantly to a decrease in radiation efficiency, the silicon substrate is lossy and can be a main factor in a decrease in radiation efficiency. Accordingly, redirection of the radiation effectively increases the antenna gain. The use of director 74 and/or reflector 72 may increase the gain of antenna structure 64 by as much as 3-6 dB, so that the total gain of antenna structure 64 can be 5.5-8 dB, which is significantly higher than prior art millimeter wave antennas. Reflector 72 and deflector 74 are illustrated as relatively tall structures for clarity of illustration. However, it should be understood that reflector 72 and deflector 74 may be shorter, taller, thicker, and/or thinner in accordance with design and manufacturing preferences. For example, reflector 72 and deflector 74, formed as metal traces, may be similar in height and width to bond pads 42 and 46.

Figure 5:
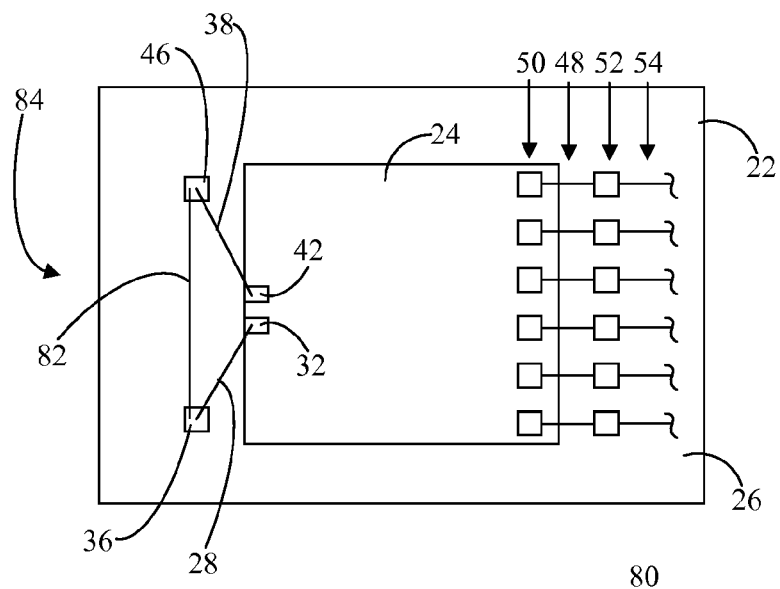
FIG. 5 shows a top plan view of a device in accordance with another embodiment of the invention.

FIG. 5 shows a top plan view of a device 80 in accordance with another embodiment of the invention. Device 80 includes IC die 24 coupled to top surface 26 of substrate 22. In addition, device 80 includes bond wire 28 interconnecting die bond pad 32 with insulated bond pad 36, and device 80 includes bond wire 38 interconnecting die bond pad 42 with insulated bond pad 46. In addition, device 80 includes a conductive trace 82 electrically interconnecting insulated bond pad 36 with insulated bond pad 46. Thus, bond wires 28 and 38 with the interconnecting conductive trace 82 form a folded dipole configuration of an antenna structure 84.

Conductive trace 82 may have a length that is a half wavelength, and may be formed from copper, gold, aluminum, and the like. In general, folded dipole antenna structure 84 works similarly to dipole antenna structure 64, but the radiation resistance can be as much as four times greater then the radiation resistance expected in a dipole antenna structure. The folded dipole configuration of antenna structure 84 can improve bandwidth over a standard half-wave dipole, such as antenna structure 64. Antenna structure 84 may further include reflector 72 (FIG. 3) and/or director 74 (FIG. 3) to further enhance the radiation characteristics of structure 84.

FIG. 6 shows a top plan view of a device 86 in accordance with another embodiment of the invention. Device 86 includes an IC die 88 coupled to a top surface 90 of a substrate 92. In addition, device 86 includes a bond wire 94 interconnecting a die bond pad 96 with an insulated bond pad 98 formed on top surface 90 of substrate 92. Another bond wire 100 interconnects another die bond pad 102 with another insulated bond pad 104 formed on top surface 90 of substrate 92. Bond wires 94 and 100 are located proximate an outer corner 105 of IC die 88. In addition, bond wires 94 and 100 extend away from respective ones of die bond pads 96 and 102 such that bond wires 94 and 100 minimally extend over the top surface of IC die 88. Thus, a dipole configuration of an antenna structure 106 is formed at outer corner 105 of IC die 88.

Antenna structure 106 is positioned at outer corner 105 of IC die 88 to reduce potential radiation pattern degradation due to the presence of the silicon-based IC die 88. In addition, the location for antenna structure 106 may reduce the interference from antenna structure 106 back to circuitry within IC die 88. It should be understood, that device 86 can further include a director and/or reflector such as those discussed in connection with FIG. 3 to further improve radiation efficiency. Likewise, antenna structure 106 can be modified with an additional conductive trace to form the folded dipole configuration of FIG. 5, as discussed above.

Referring to FIGS. 7-8, FIG. 7 shows a top plan view of a device 108 in accordance with another embodiment of the invention, and FIG. 8 shows a side view of device 108. Device 108 includes an IC die 110 coupled to a top surface 112 of a substrate 114. In addition, device 106 includes a bond wire 116 interconnecting a die bond pad 118 with an insulated bond pad 120 both of which are formed on a top surface 122 of IC die 110. Similarly, another bond wire 124 interconnects another die bond pad 126 with another insulated bond pad 128 both of which are also formed on top surface 122 of IC die 110. Thus, each of bond wires 116 and 124 extends above IC die 110 such that a dipole configuration of an antenna structure 130 is formed directly on IC die 110.

Bond wires 116 and 124 can be bonded to IC die 110 during chip level fabrication since no bonding points for antenna structure 130 are located on substrate 114. Such an "on chip" configuration may slightly decrease manufacturing time, may result in more consistent connections between the bond pads, and can save valuable real estate on substrate 114 that was otherwise being utilized in the previous embodiments for placement of insulated bond pads. Of course, other embodiments of antenna structure 130 can include reflectors, directors, and/or an additional trace for a folded dipole configuration, as discussed above.

FIG. 9 shows a top plan view of a device 132 in accordance with another embodiment of the invention. Device 132 includes an IC die 134 coupled to a top surface 136 of a substrate 138. In addition, device 132 includes a bond wire 140 interconnecting a die bond pad 142 with an insulated bond pad 144 both of which are formed on a top surface 146 of IC die 134. Similarly, another bond wire 148 interconnects another die bond pad 150 with another insulated bond pad 152 both of which are also formed on top surface 146 of IC die 134. Thus, each of bond wires 140 and 148 extends above IC die 134 such that a dipole configuration of an antenna structure 154 is formed directly on IC die 134.

Device 132 further includes a reflector 156 and a director 158 both of which are formed on top surface 146 of IC die 134. Reflector 156 serves a similar function to reflector 72 (FIG. 3) of reflecting the radiation toward a predetermined direction and enhancing radiation efficiency. Similarly, director 158 serves a similar function to director 74 (FIG. 3) of directing the radiation pattern above top surface 146 of IC die 134. Accordingly, antenna structure 154 is an "on chip" configuration that additionally includes a reflector and director for enhancing the radiation characteristics of antenna structure 154. Again, antenna structure 154 can be formed during chip level manufacturing. Moreover, real estate on substrate 138 need not be utilized for any portion of antenna structure 154.

In summary, various embodiments of the present invention include dipole and folded dipole antenna structures formed from bond wires that are connected to associated bond pads during a conventional wire bonding process. The use of bond wires for the antenna structures eliminates the need for a distinct antenna and the requisite interconnections between an integrated circuit and the antenna. The bond wire antenna design is flexible and wide band. Consequently, conventional chip/packaging design rules can readily accommodate the performance requirements (bond wire location, wire length, diameter, and so forth) of a millimeter wave antenna to achieve an antenna structure that is small and cost effectively fabricated. In addition, metal traces and/or additional bond wires on the substrate and on the IC chip can be readily incorporated for radiation pattern and directivity control.

Although the preferred embodiments of the invention have been illustrated and described in detail, it will be readily apparent to those skilled in the art that various modifications may be made therein without departing from the spirit of the invention or from the scope of the appended claims. For example, the bond wire structures of the present invention can be readily adapted to a monopole antenna structure.

What is claimed is:

1. An antenna structure for an integrated circuit die coupled to a top surface of a substrate, said antenna structure comprising:

a bond wire having a proximal end and a distal end, said proximal end being configured for attachment to a die bond pad on said integrated circuit die;

an insulated bond pad coupled to said distal end of said bond wire, said bond wire serving as a radiating element of said antenna structure; and a reflector element adapted for attachment to at least one of said integrated circuit die and said top surface of said substrate for reflecting a radiation pattern of said bond wire toward a pre-determined direction.

2. An antenna structure as claimed in claim 1 wherein said insulated bond pad is conductive for forming a capacitance in series with said bond wire.

3. An antenna structure as claimed in claim 1 wherein said bond wire is a first bond wire, said insulated bond pad is a first insulated bond pad, said radiating element is a first radiating element, and said antenna structure further comprises:

a second bond wire having a second proximal end and a second distal end, said second proximal end being configured for attachment to a second die bond pad on said integrated circuit die; and a second insulated bond pad coupled to said second distal end of said second bond wire, said second bond wire serving as a second radiating element of said antenna structure, and said first and second radiating elements forming a dipole configuration of said antenna structure.

4. An antenna structure as claimed in claim 3 further comprising a conductive trace interconnecting said first insulated bond pad with said second insulated bond pad to form a folded dipole configuration of said antenna structure.

5. An antenna structure as claimed in claim 3 wherein said first and second die bond pads are located proximate an outer corner of said integrated circuit die, and said first and second bond wires extend away from respective ones of said first and second die bond pads such that said first and second bond wires minimally extend over a top surface of said integrated circuit die.

6. An antenna structure as claimed in claim 1 wherein said insulated bond pad is configured for attachment to a substrate upon which said integrated circuit die is coupled.

7. An antenna structure as claimed in claim 1 wherein said insulated bond pad is configured for attachment upon said integrated circuit die.

8. An antenna structure as claimed in claim 1 further comprising a director element adapted for attachment to at least one of said integrated circuit die and said top surface of said substrate for controlling a direction of said radiation pattern of said bond wire.

9. An antenna structure as claimed in claim 1 wherein said antenna structure has a resonant frequency of approximately 30 GHz and greater.

10. An antenna structure as claimed in claim 1 wherein said integrated circuit die includes a low noise amplifier and a power amplifier, and said antenna structure is coupled to at least one of said low noise amplifier and said power amplifier.

11. A method of forming an antenna structure for an integrated circuit die comprising:

providing a substrate having a top surface;

coupling said integrated circuit die to said top surface of said substrate;

attaching a proximal end of a bond wire to a die bond pad on said integrated circuit die;

attaching a distal end of said bond wire to an insulated bond pad on one of said top surface of said substrate and said integrated circuit die, said bond wire functioning as a radiating element of said antenna structure for said integrated circuit die; and attaching a reflector element to at least one of said integrated circuit die and said top surface of said substrate for reflecting a radiation pattern of said bond wire toward a pre-determined direction.

12. A method as claimed in claim 11 further comprising:

attaching a second proximal end of a second bond wire to a second die bond pad on said integrated circuit die; and attaching a second distal end of said second bond wire to a second insulated bond pad on one of said top surface of said substrate and said integrated circuit die, said second bond wire functioning as a second radiating element of said antenna structure, and said bond wire and said second bond wire forming a dipole configuration of said antenna structure.

13. A method as claimed in claim 12 further comprising interconnecting a conductive trace between said first and second insulated bond pads to form a folded dipole configuration of said antenna structure.

14. A device comprising:

a substrate having a top surface, said top surface including a first insulated bond pad and a second insulated bond pad;

an integrated circuit die coupled to said top surface of said substrate, said integrated circuit die including a first die bond pad and a second die bond pad;

a first bond wire having a first proximal end coupled to said first die bond pad and a first distal end coupled to said first insulated bond pad; and a second bond wire having a second proximal end coupled to said second die bond pad and a second distal end coupled to said second insulated bond pad, said first and second bond wires functioning as a radiating elements to form a dipole antenna structure for said integrated circuit die having a resonant frequency of approximately 30 GHz and higher; and a director element attached to said substrate for controlling a direction of a radiation pattern of said first and second bond wires.

15. A device as claimed in claim 14 further comprising a conductive trace interconnecting said first insulated bond pad with said second insulated bond pad to form a folded dipole configuration of said dipole antenna structure.

16. A device as claimed in claim 14 further comprising:

a reflector element attached to said integrated circuit die for reflecting said radiation pattern of said first and second bond wires toward a pre-determined direction; and.

17. A device as claimed in claim 14 wherein:

said substrate includes an input/output bond pad located on said top surface of said substrate such that said integrated circuit die is positioned between said input/output bond pad and said first and second insulated bond pads;

said integrated circuit die further includes a third die bond pad arranged on said integrated circuit die remote from said first and second die bond pads; and said device further comprises a third bond wire interconnecting said third die bond pad and said input/output bond pad.

18. A device as claimed in claim 17 further comprising a reflector element attached to said integrated circuit die between said third die bond pad and said first and second die bond pads for reflecting a radiation pattern of said first and second bond wires toward a pre-determined direction away from said third die bond pad.

* * * * *